(12) United States Patent
Ungar

(10) Patent No.: US 7,139,299 B2
(45) Date of Patent: Nov. 21, 2006

(54) DE-TUNED DISTRIBUTED FEEDBACK LASER DIODE

(75) Inventor: Jeffrey E. Ungar, Valley Village, CA (US)

(73) Assignee: Quintessence Photonics Corporation, Sylmar, CA (US)

( * ) Notice: Subject to any disclaimer, the term of this patent is extended or adjusted under 35 U.S.C. 154(b) by 0 days.

(21) Appl. No.: 10/377,040

(22) Filed: Feb. 28, 2003

(65) Prior Publication Data

US 2003/0210724 A1    Nov. 13, 2003

Related U.S. Application Data

(60) Provisional application No. 60/361,792, filed on Mar. 4, 2002.

(51) Int. Cl.
  *H01S 5/00*    (2006.01)
(52) U.S. Cl. ............... 372/50.1; 372/50.11; 372/96
(58) Field of Classification Search ............ 372/96, 372/50, 102, 20, 50.22, 50.1, 50.11
  See application file for complete search history.

(56) References Cited

U.S. PATENT DOCUMENTS

| | | | | |
|---|---|---|---|---|
| 4,713,821 A | * | 12/1987 | Bradford et al. ......... 372/44.01 |
| 4,744,089 A | | 5/1988 | Montroll et al. ............. 372/50 |
| 4,856,017 A | * | 8/1989 | Ungar ........................ 372/96 |
| 4,908,833 A | * | 3/1990 | Chraplyvy et al. ........... 372/96 |
| 5,003,550 A | | 3/1991 | Welch et al. |
| 5,020,153 A | * | 5/1991 | Choa et al. ................ 398/138 |
| 5,103,456 A | | 4/1992 | Scifres et al. |
| 5,119,393 A | * | 6/1992 | Oka et al. ................... 372/50 |
| 5,175,643 A | * | 12/1992 | Andrews .................... 359/339 |
| 5,260,822 A | | 11/1993 | Missaggia et al. ......... 359/337 |
| 5,539,571 A | | 7/1996 | Welch et al. ............... 359/344 |
| 5,696,779 A | | 12/1997 | Welch et al. ................ 372/18 |
| 5,793,521 A | | 8/1998 | O'Brien et al. ............ 359/334 |
| 5,894,492 A | | 4/1999 | Welch et al. ................ 372/50 |
| RE37,354 E | | 9/2001 | Welch et al. |
| 6,580,740 B1 | * | 6/2003 | Funabashi et al. ........... 372/50 |

FOREIGN PATENT DOCUMENTS

EP    0 529 817 A    3/1993

OTHER PUBLICATIONS

Suhara, E. et al.,"Monolithic integration of QW-DFB laser master oscillator power ampliefier and grating outcoupler", Electronics Letters, IEE Stevenage, GB, vol. 33, No. 14, Jul. 1997.

* cited by examiner

*Primary Examiner*—James Menefee
(74) *Attorney, Agent, or Firm*—Ben J. Yorks; Irell & Manella LLP

(57) ABSTRACT

A semiconductor laser that includes a feedback laser section and an amplifier section. The feedback laser section generates a laser beam that has a maximum intensity at a first wavelength. The amplifier section amplifies the laser beam into a high powered beam. The amplifier section is constructed to have a peak optical gain located at a second wavelength that is offset from the first wavelength. Offsetting the wavelength generated in the feedback laser section from the peak gain wavelength of the amplifier section will result in an output beam that has a much broader linewidth that the feedback section alone. The broader linewidth is relatively stable even when part of the light reflects back into the semiconductor laser.

10 Claims, 1 Drawing Sheet

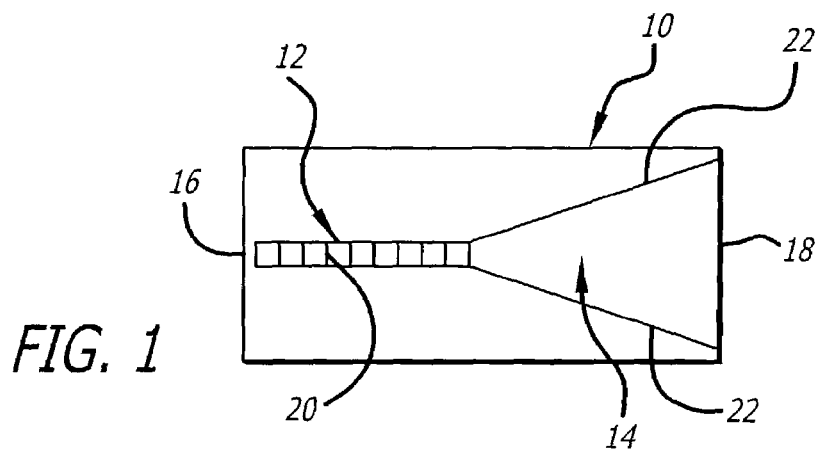
FIG. 1
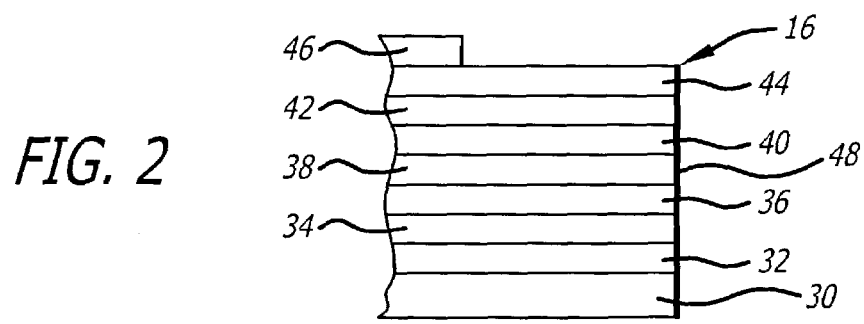
FIG. 2
FIG. 3
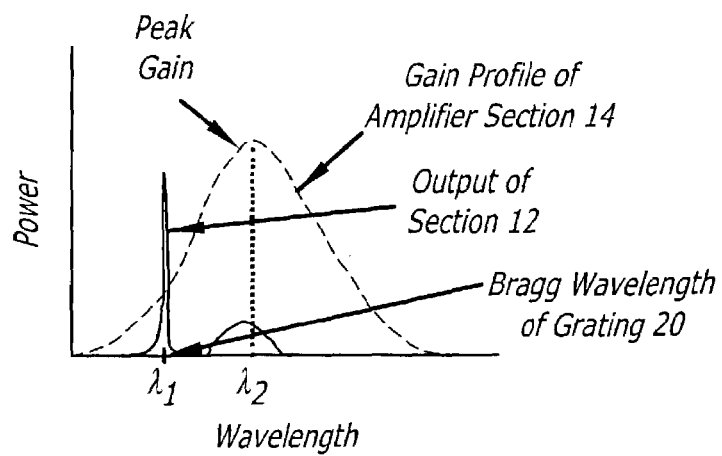

DE-TUNED DISTRIBUTED FEEDBACK LASER DIODE

REFERENCE TO CROSS RELATED APPLICATION

This application claims priority under 35 U.S.C §119(e) to provisional Application No. 60/361,792 filed on Mar. 4, 2002.

BACKGROUND OF THE INVENTION

1. Field of the Invention

The subject matter disclosed generally relates to the field of semiconductor lasers.

2. Background Information

Semiconductor lasers are used in a variety of system applications. For example, semiconductor lasers are used as a light source in fiber optic communication systems. It is generally desirable to provide a semiconductor laser that has a high power output. High power output reduces the number of repeaters and amplifiers required for the optical system.

High powered semiconductor lasers such as laser diodes generate laser beams with a relatively low quality when operated at powers of 0.5 watts (W) or more. Low quality beams are generally difficult to couple into single mode fiber optic cables.

There have been developed laser diodes that can produce high quality beams beyond 1 W. Such high powered laser diodes typically include a feedback section which generates the laser beam and a separate amplification section that amplifies the beam. It has been found that some of the light generated by these high powered laser diodes will reflect back into the device. Because of the high coherence and narrow linewidth of the laser beam the reflected light will create feedback that destabilizes the laser. This undesirable feedback can be minimized or reduced by optical isolators. Isolators add to the complexity and cost of producing the optical system.

BRIEF SUMMARY OF THE INVENTION

A semiconductor laser that includes a feedback laser section coupled to an amplifier section. The feedback laser section generates a laser beam with a maximum intensity at a first wavelength. The amplifier section amplifies the laser beam. The amplifier section has a peak optical gain at a second wavelength that is offset from the first wavelength.

BRIEF DESCRIPTION OF THE DRAWINGS

FIGS. 1 is an illustration of a semiconductor laser;

FIG. 2 is an illustration showing the layers of the semiconductor laser;

FIG. 3 is a graph showing the gain versus wavelength of the feedback and amplifier sections of the semiconductor laser.

DETAILED DESCRIPTION

Disclosed is a semiconductor laser that includes a feedback laser section and an amplifier section. The feedback section generates a laser beam that has a maximum intensity at a first wavelength. The amplifier section amplifies the laser beam into a high powered beam. The amplifier section is constructed to have a peak optical gain located at a second wavelength that is offset from the first wavelength. Offsetting the wavelength generated in the feedback laser section from the peak gain wavelength of the amplifier section will result in an output beam that has a much broader linewidth than the feedback section alone. The broader linewidth results in the overall device being relatively stable even when part of the light reflects back into the semiconductor laser.

Referring to the drawings more particularly by reference numbers, FIG. 1 shows a semiconductor laser 10. The semiconductor laser 10 includes a feedback laser section 12 and an amplifier section 14 located within a semiconductor die 16. The feedback laser section 12 generates a laser beam. The amplifier section 14 amplifies and increases the optical power of the laser beam. The amplified laser beam exits an output facet 18 of the laser 10.

The feedback laser section 12 may be of the distributed feedback type. A distributed feedback includes a diffration grating 20. Although a distributed grating 20 is shown and described, it is to be understood that the feedback laser section 12 may have other means for generating a laser beam. For example, the feedback laser section 12 may be a distributed Bragg reflector (DBR) laser.

The amplifier section 14 preferably includes a pair of tapered edges 22 that are widest near the output facet 18. The edges 22 are tapered in order to most efficiently match the broadening profile of the optical beam. The semiconductor laser 10 can be used to generate high optical output power in the range of 5 watts.

FIG. 2 shows the different layers 30, 32, 34, 36, 38, 40, 42, 44 and 46 of an embodiment of the semiconductor laser 10. The laser 10 may include a lower cladding 32 formed on a substrate 30. The substrate 30 may be an n-doped Indium Phosphide (InP) or Gallium Arsenide (GaAs) material. The cladding 32 may be an n-doped InP or GaAs material.

The laser 10 may further have a multi-quantum well active layer 36 located between confinement layers 34 and 38. Confinement layer 34 may be a n-doped InGaAsP or $Al_yGa_{1-y}As$ material. Confinement layer 38 may be a p-doped InGaAsP or $Al_yGa_{1-y}As$ material. Layers 40, 42 and 44 may be upper cladding that includes p-doped material. For example, layer 40 may be p-doped InGaAsP or $Al_xGa_{1-x}As$. Layer 42 may be p-doped InGaAsP or $Al_zGa_{1-z}As$ material. Layer 44 may be p-doped InP or $Al_xGa_{1-x}As$ material. Layer 46 may be an electrical contact layer containing $p^+$-doped InGaAs or GaAs material.

The layers 34, 36 and 38 create a PN junction that will generate stimulated light emission in response to a flow of electrical current. Cladding layers 32, 40, 42 and 44 form a waveguide that guides the light. The grating within the distributed feedback laser section 12 is typically formed within layers 34, 36 and 38. Current is passed through both the distributed feedback laser section 12 and the amplifier section 14 through contacts formed on the surfaces of these section 12 and 14. The current causes stimulated emission in the distributed feedback laser section 12 where coherent light is formed. The current causes further stimulated emission within the amplifier section 14 which increases the optical power of the laser 10.

The semiconductor laser 10 can be constructed by initially forming layers 32, 34, 36, 38, 40 and 42 on the substrate 30. A grating can then be formed in the distributed feedback laser section 12 of 42. The remaining layers 44 and 46 can then be sequentially formed onto layer 38. All the layers can be formed with known epitaxial semiconductor fabrication processes. The embodiment shon in FIG. 2 is merely exemplary. It is to be understood that the semiconductor laser may be constructed from different materials and/or different layers.

FIG. 3 shows operation of the different sections of the semiconductor laser 10. The period of the grating 20 is constructed to generate a laser beam that has a maximum intensity at a first wavelength $\lambda_1$. The amplifier section 14 is constructed to have a peak optical gain at a second wavelength $\lambda_2$. Conventional semiconductor lasers are designed so that the wavelength generated by the feedback laser section is the same as the wavelength for peak optical gain in the amplifier section to obtain optimum optical gain within the device. This may result in an unstable laser if a portion of the output beam reflects back into the device.

Offsetting the first wavelength $\lambda_1$ from the second wavelength $\lambda_2$ results in a device 10 wherein the amplifier section 14 strongly amplifies wavelengths in the "tail" of the gain curve while providing weak amplification at the peak gain of the curve. The resultant output beam has a relatively wide linewidth. By way of example, the linewidth of the output beam may be 10 nanometers or more. A semiconductor laser that generates a broad linewidth is more stable than a laser that creates a narrow linewidth, particularly for high powered beam, where a portion of the beam is reflected back into the device.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A semiconductor laser, comprising:
   a feedback laser section that generates a laser beam with a maximum intensity at a first wavelength; and,
   an amplifier section that is externally coupled to said feedback laser section to amplify the laser beam and has a peak optical gain at a second wavelength that is offset from the first wavelength to broaden a line width of said laser beam, said amplifier section having a pair of tapered edges.

2. The semiconductor laser of claim 1, wherein said feedback laser section includes a diffraction grating.

3. The semiconductor laser of claim 1, wherein said feedback laser section includes a distributed feedback diffraction grating.

4. The semiconductor laser of claim 1, wherein said feedback laser section includes a distributed Bragg reflector.

5. A semiconductor laser, comprising:
   first means for generating a laser beam with a maximum intensity at a first wavelength; and,
   second means for amplifying the laser beam, said second means having a peak optical gain at a second wavelength that is offset from the first wavelength to broaden a line width of said laser beam said second means including a pair of tapered edges.

6. The semiconductor laser of claim 5, wherein said first means includes a diffraction grating.

7. The semiconductor laser of claim 5, wherein said first means includes a distributed feedback diffraction grating.

8. The semiconductor laser of claim 5, wherein said first means includes a distributed Bragg reflector.

9. A method for operating a semiconductor laser, comprising:
   generating a laser beam with a maximum intensity at a first wavelength within a feedback laser section; and,
   amplifying the laser beam with an amplifier section that is external to said feedback laser section and has a pair of tapered edges, the amplifier section has a peak optical gain at a second wavelength that is offset from the first wavelength to broaden a line width of the laser beam.

10. The method of claim 9, wherein the first wavelength is defined by the grating period of a diffraction grating.

* * * * *